United States Patent [19]

Mihara et al.

[11] Patent Number: 5,508,954
[45] Date of Patent: Apr. 16, 1996

[54] METHOD AND APPARATUS FOR REDUCED FATIGUE IN FERROELECTRIC MEMORY

[75] Inventors: Takashi Mihara, Saitama; Hitoshi Watanabe, Tokyo; Hiroyuki Yoshimori, Kanagawa, all of Japan; Carlos A. Paz de Araujo; Larry D. McMillan, both of Colorado Springs, Colo.

[73] Assignees: Symetrix Corporation, Colorado Springs, Colo.; Olympus Optical Co., Ltd., Tokyo, Japan

[21] Appl. No.: 395,582

[22] Filed: Feb. 27, 1995

[51] Int. Cl.[6] .................................................. G11C 11/12
[52] U.S. Cl. ........................................ 365/145; 365/149
[58] Field of Search ................................. 365/145, 149, 365/189.01, 117, 65

[56] References Cited

U.S. PATENT DOCUMENTS

| | | | |
|---|---|---|---|
| 4,888,733 | 12/1989 | Mobley | 365/145 |
| 4,893,272 | 1/1990 | Eaton, Jr. et al. | 365/145 |
| 4,910,708 | 3/1990 | Eaton, Jr. et al. | 365/145 |
| 5,086,412 | 2/1992 | Jaffe et al. | 365/145 |
| 5,270,967 | 12/1993 | Moazzami et al. | 365/145 |

*Primary Examiner*—David C. Nelms
*Assistant Examiner*—Vu A. Le
*Attorney, Agent, or Firm*—Duft, Graziano & Forest

[57] ABSTRACT

A method and apparatus for programming ferroelectric memory cells which reduces polarizability fatigue effects of switching polarization of the ferroelectric devices associated with the memory cells such as ferroelectric capacitors and transistors. Alteration of the pulse width duty cycle associated with signals used to switch ferroelectric device polarization is shown to reduce polarizability fatigue of the ferroelectric material thereby increasing the useful life of ferroelectric memory cells. Methods and apparatus for producing a signal pulse duty cycle in the range 2–30% is disclosed and shown to improve the useful life of the ferroelectric material.

14 Claims, 5 Drawing Sheets

METHOD AND APPARATUS FOR REDUCED FATIGUE IN FERROELECTRIC MEMORY

BACKGROUND OF THE INVENTION

1. FIELD OF THE INVENTION

The invention relates, in general, to non-volatile electronic memories and more particularly to a method and apparatus for reducing fatigue on a ferroelectric device in a memory cell by altering the duty cycle of signals used for switching the ferroelectric material polarization.

2. STATEMENT OF THE PROBLEM

It is known that ferroelectric materials are capable of retaining a polarization which can be used to store information in a non-volatile memory. For example, if a strong enough electric field is placed across a ferroelectric capacitor, when the electric field is removed, a polarization in the direction of the field remains within the ferroelectric material of the capacitor. If the electric field is placed across the same capacitor in the opposite direction, when the field is removed, a polarization in the opposite direction remains within the ferroelectric capacitor. Electronic sense circuits have been designed to associate the remnant polarization in one direction with a logic "1" state, and remnant polarization in the opposite direction with a logic "0" state. A useful circuit for this purpose is disclosed in co-pending U.S. patent application Ser. No. 08/092,233, filed on July 15, 1993 by Mihara et al. These sense circuits are similar to, and adapted from, those found in more traditional DRAM devices. In sensing the polarization state of a ferroelectric capacitor, the polarization is altered, therefor the sense circuit also includes a capability to re-write the original polarization state back to the memory cell after sensing the present state.

Ferroelectric RAM structures, like traditional memory structures, include memory cells arranged in rows and columns. Each memory cell typically includes at least one transistor having a gate, source, and drain, and a capacitor having a pair of plate electrodes. Each memory cell further includes plate lines connected to one plate electrode of the capacitor in each cell, bit lines connected to the other plate of the capacitor through the transistor, and word lines connected to the control gate of the transistor. The transistor acts as a switch controlled by its gate, to connect the capacitor to the plate line.

All known prior designs for memories which utilize ferroelectric devices share a common problem in that the frequent switching of the polarization of a ferroelectric material tends to fatigue the ferroelectric material. Frequent switching of the ferroelectric material, over time, is believed to exacerbate ionic migration of point charge defects within the ferroelectric crystal. The ionized molecules tend to be forced toward the exterior boundaries of the ferroelectric crystal by continuing frequent changes in polarization of the ferroelectric material. The ability of ferroelectric material to retain a remnant polarization state diminishes as the lattice structure of the material breaks down due to ionic migration. In normal operation many millions of operations per second may be performed on a memory cell which may switch, and thereby fatigue, the ferroelectric capacitor in a memory cell. If the ferroelectric RAM fatigues quickly, the memory has too short a useful lifetime. For example, each write operation to a memory cell which changes the contents of the memory cell causes a switch in the polarization of the ferroelectric material. In addition, each read operation, as discussed above, may cause the polarization of the ferroelectric capacitor to be switched twice: once to sense the present polarization (by destructively sensing the polarization), and again to restore the polarization. This fatigue of ferroelectric material as used in capacitors of non-volatile RAMs has been a contributing factor in the lack of commercial success for ferroelectric RAM memory devices.

SOLUTION TO THE PROBLEM

The present invention reduces the above identified fatigue problem by providing apparatus and methods applied within a memory device which switches the ferroelectric capacitor polarization in a manner which reduces the fatigue of the ferroelectric material.

As in all prior designs, the present invention recites the application of signals to the electrodes of a ferroelectric capacitor in a memory cell to switch the polarization of the ferroelectric material when the electric field potential between the electrodes of the ferroelectric capacitor reaches a sufficient (coercive threshold) amplitude. These signals may be characterized by their "duty cycle." The duty cycle of a signal is broadly defined herein as the ratio of working time of a signal versus total active time of the signal.

Prior designs have applied signals which have duty cycles approaching 100%. In other words, the signal is active during the entire period it is applied to the ferroelectric device electrodes by the addressing logic of the RAM array. The present invention comprises methods and apparatus for a drive circuit which controls the duty cycle of signals applied to the electrodes of a ferroelectric capacitor. Lower duty cycle ratios have been found to reduce the fatigue of the ferroelectric material. Specifically, lower duty cycle ratios in the range of 2% through 30% are found to reduce the fatiguing effect of frequent changes in polarization of the ferroelectric capacitor of a memory cell.

One exemplary embodiment of the present invention produces a signal waveform applied to the electrodes of a ferroelectric device in a memory cell in which the signal duty cycle ratio is approximately 15%. This signal modification is demonstrated to reduce fatigue in ferroelectric devices and thereby increase the useful life of the ferroelectric device by more than three orders of magnitude. Numerous other features, objects and advantages of the present invention will become apparent from the following description when read in conjunction with the accompanying drawings.

DESCRIPTION OF THE PREFERRED EMBODIMENT

MEMORY ARRAY CONTROL AND ADDRESSING

Figure 1:
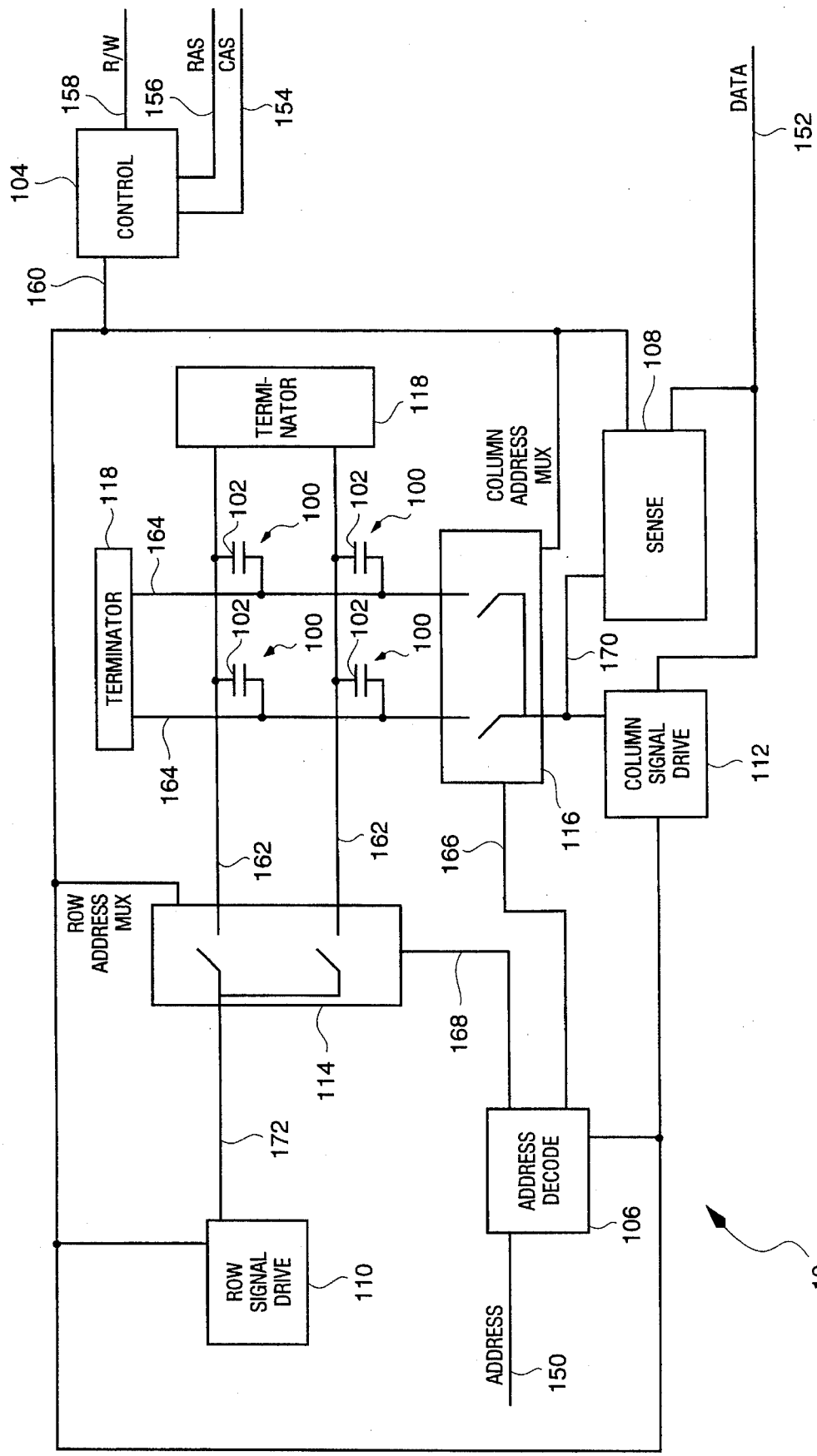
FIG. 1 is a block diagram of a exemplary embodiment of a memory array device which includes the apparatus, and employs the methods, of the present invention.

FIG. 1 shows an overview of a typical memory array 10 comprising four memory cells 100 arranged in a two by two matrix. It will be recognized by one skilled in the art that memory array 10 may be scaled to many different sizes as particular application may require. Preferably, memory array 10 comprises a number of rows and a number of columns, each such number being a power of two so as to simplify the associated logic designs for address decoding in typical computing applications. Memory cells 100 are often referred to as "raw" cells because each cell is designed with a single ferroelectric capacitor 102. In the embodiment of FIG. 1, each memory cell 100 includes a ferroelectric capacitor 102, although, as known in the art, it may be some other ferroelectric device, such as a ferroelectric transistor. "Ferroelectric memory element" as used herein refers to any ferroelectric devices used within a memory cell 100. Ferroelectric capacitor 102 in each memory cell 100 is coerced to one of two directions of polarization by application of a coercive electric field. Ferroelectric capacitor 102 retains a remnant polarization after the electric field is removed. Sense 108 is designed to associate the remnant polarization in one direction with a logic "1" state, and remnant polarization in the opposite direction with a logic "0" state.

Memory control and addressing circuits described herein are operable in conjunction with row signal drive 110 and column signal drive 112 circuits which apply signals to the electrodes of a selected one of the plurality of memory cells 100 of the memory array 10. To access a particular memory cell 100, first, a utilizing means, (not shown, hereinafter referred to as CPU), applies a signal to input R/W 158 to indicate whether the memory cycle is a read or write operation. If input R/W 158 indicates that the memory cycle is to be a write operation to memory array 10, then the CPU also applies a data value to data bus 152. Next, CPU applies a row address to address bus 150 indicating which of the two rows of memory array 10 is to be accessed by the memory cycle and applies a signal to RAS 156 to indicate that the row address is valid on address bus 150. Next, CPU applies a column address to address bus 150 indicating which of the two columns of memory array 10 to be accessed by the memory cycle and applies a signal to CAS 154 to indicate that the column address is valid on address bus 150. If R/W 158 indicates that the memory cycle is to be a read operation from memory array 10, then the current state of the addressed bit is sensed by sense 108 over bus 170 and applied to data bus 152. It will be recognized by one skilled in the art that a read memory cycle of a ferroelectric memory cell typically requires a write operation to restore the contents of the memory cell 100 after the read cycle senses the current data value in the memory cell. A read operation sense of the polarization of the ferroelectric capacitor 102 may alter the polarization in the process. The methods and apparatus used to sense the polarization of the ferroelectric capacitor are discussed in the referenced art cited above.

In the block diagram of FIG. 1, control logic 104 senses signals applied to inputs R/W 158, RAS 156, and CAS 154 by a CPU (not shown) which cause control logic 104 to control other components of memory array 10 by application of signals to control bus 160. These other components decode the CPU supplied address into a selected row and column associated with a desired memory cell 100. One skilled in the art will readily recognize the address decode apparatus and methods described herein. Such techniques and logic circuits are known in the art and are provided herein for purposes of describing an exemplary environment in which the present invention is applicable. Control logic 104 applies a signal to address decode 106 over control bus 160 when a signal is sensed on input RAS 156. In response, address decode 106 controls row address mux 114 by applying signals to bus 168 indicative of the row selected by the value applied to address bus 150 by CPU (not shown). Row address mux 114 applies the output of row signal drive 110 on bus 172 to either of two word lines 162 depending on the output of address decode 106 received on bus 168. In like manner, control logic 104 applies a signal to column address decode 106 when a signal is sensed on input CAS 154 causing address decode 106 to control column address mux 116 by applying signals to bus 166 indicative of the column selected by the value applied to address bus 150 by CPU (not shown). Column address mux 116 connects bus 170 to either of two bit lines 164 depending on the output of address decode 106 received on bus 166.

If the signal on input R/W 158 indicates a write access to a selected memory location, column address mux 116 serves to connect the output signal column signal drive 112 to one of two bit lines 164 to provide an appropriate electric field across a ferroelectric capacitor 102 at the intersection of a word line 162 and a bit line 164. The polarity of the signal output from column signal drive 112 onto bus 170 is determined by the signal received on data bus 152. The amplitude of the electric field present at the ferroelectric capacitor 102 at the intersection of a word line 162 and a bit line 164 is determined by the magnitude, timing, and shape of the signals generated at the outputs of row signal drive 110 and column signal drive 112. When the amplitude of the electric field exceeds a threshold value, (the coercive threshold), the polarity of the ferroelectric capacitor is changed to match the polarity of the electric field. If R/W 158 indicates a read access to a memory location, control logic 104 causes column address mux 116 to connect the bidirectional signal of sense 108 through bus 170 to one of two bit lines 164. Sense 108 senses the current polarity of the ferroelectric capacitor 102 at the intersection of the word line 162 and the bit line 164 selected by row address mux 114 and column address mux 116, respectively. Sense 108 applies a signal to data bus 152 indicative of the present polarity of the sensed ferroelectric capacitor 102. Sense 108 senses the polarity of the selected ferroelectric capacitor in a non-destructive manner by restoring the capacitor to the sensed value. Circuits which sense the direction of polarity are known to those of ordinary skill in the art as discussed above. Terminators 118 provide impedance matching on word lines 162 and bit lines 164 as is known in the art.

In the memory array 10 of FIG. 1, the electric field applied to a selected memory cell 100 is determined by the total electric field across the two electrodes of the selected ferroelectric capacitor 102. The magnitude of this field is the sum of the fields applied to both the selected word line 162 and the selected bit line 164. A lower duty cycle pulse of the present invention is generated by the row signal drive 110 and applied to the selected word line 162 or the column signal drive 112 and applied to the selected bit line 164. It will be recognized that this pulse may then be applied to either or both electrodes of the selected ferroelectric capacitor 102 to achieve the lower duty cycle pulse of the present invention for programming the polarity of the selected memory cell 100.

Figure 2:
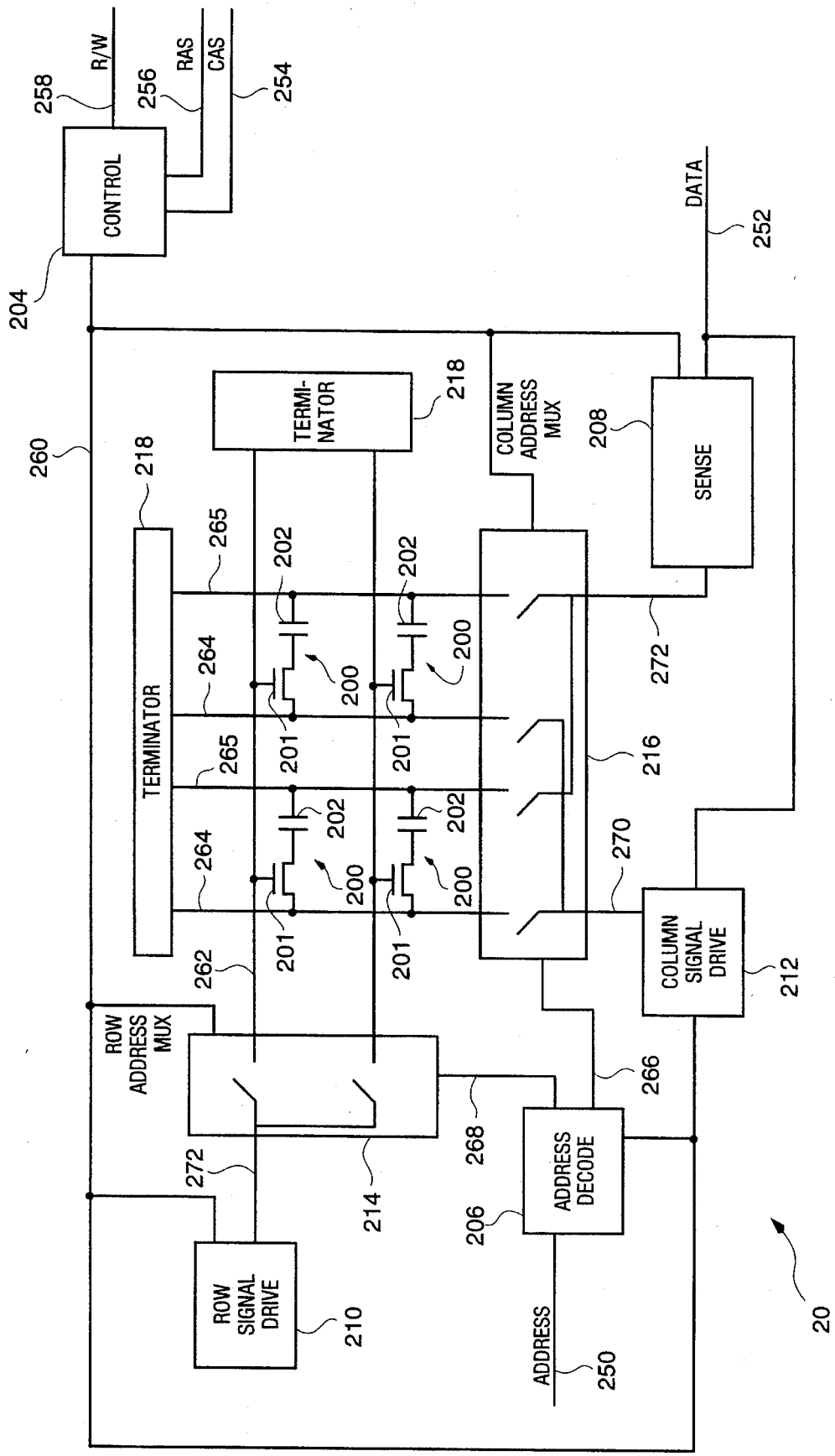
FIG. 2 is a block diagram of another exemplary embodiment of a memory array device which includes the apparatus, and employs the methods, of the present invention.

FIG. 2 shows an overview of another possible memory array 20 comprising four memory cells 200 arranged in a two by two matrix. Memory cells 200 are referred to as "active" cells because each cell is designed with a single ferroelectric capacitor 202 and a gating transistor 201. Ferroelectric capacitor 202 in each memory cell 200 is coerced to one of two directions of polarization by application of an electric field having an amplitude greater than the coercive electric field required to switch the ferroelectric capacitor 202 polarization.

Figure 6:
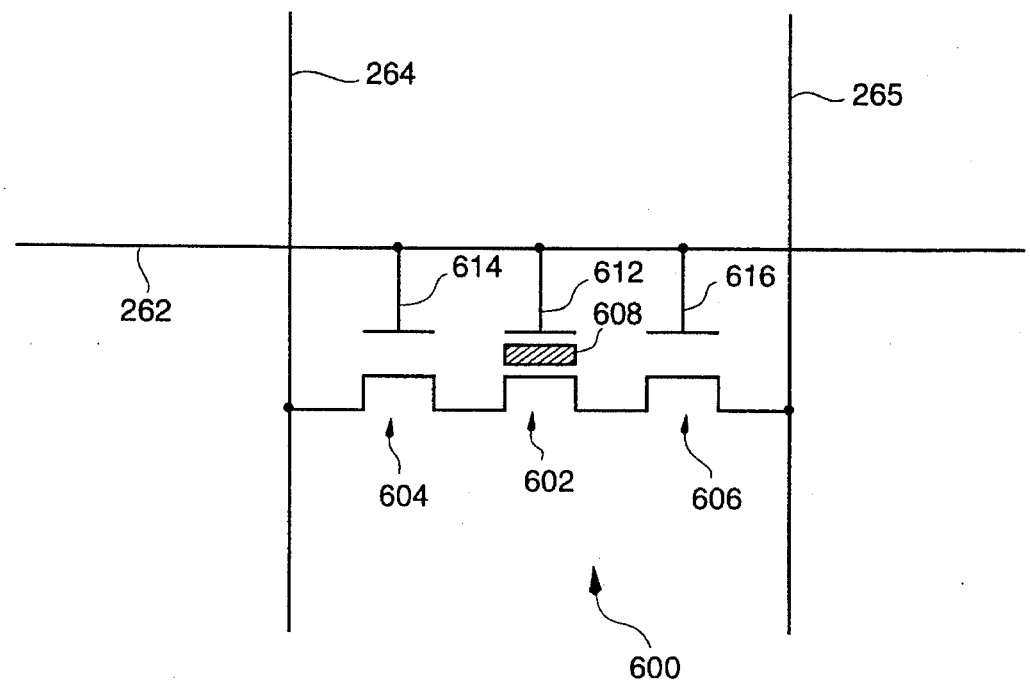
FIG. 6 diagrams an alternative embodiment of a circuit which implements a single "active" memory cell as may be used in the embodiment of FIG. 2 with a ferroelectric transistor.

In the embodiment of FIG. 2, each memory cell 200 includes a ferroelectric capacitor 202, although, as known in the art, it may be some other ferroelectric device, such as a ferroelectric transistor. Ferroelectric memory element as used herein refers to any ferroelectric devices used within a memory cell 200. FIG. 6 shows an alternative embodiment of the circuit which comprises a single memory cell 600 in which a ferroelectric transistor 602 is used in conjunction with two gating transistors 604 and 606. The ferroelectric nature of ferroelectric transistor 602 is indicated by a rectangle which represents the ferroelectric material 608. The polarization state of ferroelectric material 608 is determined by the electric field potential between the gate 612 of ferroelectric transistor 602 and the source and drain of pass gate transistors 604 and 606. Pass gate transistors connect the signals applied to bit line 265 apply plate line 264 to the base of ferroelectric transistor 602. The gates of all three transistors 602, 604, and 606 are activated by a signal applied to word line 262. Use of a ferroelectric transistor 602 in a memory cell 600 is more fully understood with reference to co-pending U.S. patent application Ser. No. 08/330,989, filed on Oct. 28, 1994 by Mihara et al.

Ferroelectric capacitor 202 retains a remnant polarization after the electric field is removed. Sense 208 is designed to associate the remnant polarization in one direction with a digital logic "1" state, and remnant polarization in the opposite direction with a logic "0 state.

Memory control and addressing circuits described herein are operable in conjunction with row signal drive 210 and column signal drive 212 circuits which apply signals to the electrodes of a selected one of the plurality of memory cells 200 of the memory array 20. To access a particular memory cell 200, first, a utilizing means, (hereinafter assumed to be a CPU), applies a signal to input R/W 258 to indicate whether the memory cycle is a read or write operation. If R/W 258 indicates that the memory cycle is to be a write operation to memory array 20, then the CPU also applies a data value to data bus 252. Next, CPU applies a row address to address bus 250 indicating which of the two rows of memory array 20 is to be accessed by the memory cycle and applies a signal to RAS 256 to indicate that the row address is valid on address bus 250. Next, CPU applies a column address to address bus 250 indicating which of the two columns of memory array 20 is to be accessed by the memory cycle and applies a signal to CAS 254 to indicate that the column address is valid on address bus 250. If R/W 258 indicates that the memory cycle is to be a read operation from memory array 20, then the current state of the addressed bit is sensed by sense 208 over bus 272 and applied to data bus 252. It will be recognized by one skilled in the art that a read memory cycle typically requires a write operation to restore the contents of the memory cell 200 after the read cycle senses the current data value in the memory cell. A read operation sense of the polarization of the ferroelectric capacitor 202 may alter the polarization in the process. The methods and apparatus used to sense the polarization of the ferroelectric capacitor are discussed in the referenced art cited above.

In the block diagram of FIG. 2, control logic 204 senses signals applied to inputs R/W 258, RAS 256, and CAS 254 by a CPU (not shown) which cause control logic 204 to control other components of memory array 20 by application of signals to control bus 260. These other components decode the CPU supplied address into a selected row and column of the desired memory cell 200. Control logic 204 applies a signal to address decode 206 over control bus 260 when a signal is sensed on RAS 256. In response, address decode 206 controls row address mux 214 by applying signals to bus 268 indicative of the row selected by the value applied to address bus 250 by CPU (not shown). Row address mux 214 applies the output of row signal drive 210 on bus 272 to either of two word lines 262 depending on the output of address decode 206 received on bus 268. In like manner, control logic 204 applies a signal to column address decode 206 when a CAS 254 signal is received causing address decode 206 to control column address mux 216 by applying signals to bus 266 indicative of the column selected by the value applied to address bus 250 by CPU (not shown). Column address mux 216 connects bus 270 to either of two plate lines 264 depending on the output of address decode 206 received on bus 266.

If R/W 258 indicates a write access to a memory location, column address mux 216 serves to connect the output signal column signal drive 212 to one of two plate lines 264 thereby providing an appropriate electric field across a ferroelectric capacitor 202 at the intersection of a word line 262 and a plate line 264. The polarity of the signal output from column signal drive 212 onto bus 270 is determined by the signal received on data bus 252. The amplitude of the electric field present at the ferroelectric capacitor 202 at the intersection of a word line 262 and a plate line 264 is determined by the magnitude, timing, and shape of the signals generated at the outputs of row signal drive 210 and column signal drive 212. When the amplitude of the electric field exceeds a threshold value, (the coercive threshold), the polarity of the ferroelectric capacitor is changed to match the polarity of the electric field. If R/W 258 indicates a read access to a memory location, control logic 204 causes column address mux 216 to connect the bidirectional signal of sense 208 through bus 270 to one of two bit lines 265. Sense 208 senses the current polarity of the ferroelectric capacitor 202 at the intersection of the word line 262 and the bit line 265 selected by row address mux 214 and column address mux 216, respectively. Sense 208 applies a signal to data bus 252 indicative of the present polarity of the sensed ferroelectric capacitor 202. Sense 208 senses the polarity of the selected ferroelectric capacitor in a non-destructive manner by restoring the capacitor to the sensed value. Circuits which sense the direction of polarity are known to those of ordinary skill in the art as discussed above. Terminators 218 provide impedance matching on word lines 262, bit lines 265, and plate lines 264 as is known in the art.

In the memory array 20 of FIG. 2, the electric field applied to a selected memory cell 200 is determined by the total electric field across the two electrodes of the selected ferroelectric capacitor 202. The magnitude of this field is the magnitude of the signal applied to a selected plate line 264 while the signal applied to a selected word line 262 is in turn applied to the gate of the selected gating transistor 201. A lower duty cycle pulse of the present invention is generated by the row signal drive 210 and applied to the selected word line 262 or the column signal drive 212 and applied to the selected plate line 264. It will be recognized that this lower duty cycle pulse may then be applied to the unterminated electrode of the selected ferroelectric capacitor 202.

The block diagrams of FIGS. 1 and 2 are intended only as examples of embodiments of memory arrays which may employ the methods and apparatus of the present invention. One skilled in the art will recognize that many other ferroelectric RAM cell designs and memory array control designs are possible which may include the methods and apparatus of the present invention. In particular, the precise apparatus and methods for decoding a CPU supplied address as well as the timing of the various signals discussed above may be varied as required for the particular application. The use of word, bit, and plate lines for setting or sensing the contents of a selected memory cell may be varied so long as a net electric field is applied across the selected ferroelectric memory element. In addition, one skilled in the art will recognize that the ferroelectric memory element within each memory cell 100 or 200 may be any ferroelectric device such as a capacitor or a transistor. It will be recognized by one skilled in the art that many equivalent methods and apparatus may be employed for selecting a particular one of the plurality of memory cells 100 or 200 in a memory array 10 or 20. In all such cases, the selection methods and apparatus are operable in conjunction with signal drive circuits which apply signals to the electrodes of a selected ferroelectric capacitor for purposes of changing the polarization thereof.

Fatigue Reduction Method

It is known by those skilled in the art that repeated, rapid, changes in the polarization of a ferroelectric material causes a reduction in the polarizability of the ferroelectric material "Polarizability", as used herein, is a measure of the degree of remnant polarization in a ferroelectric material following application and removal of a coercive electric field. "Polarizability fatigue", as used herein, is defined to be a reduction in the polarizability of a ferroelectric material in response to repetitive cycling of the direction of remnant polarization of a ferroelectric material. Methods of the present invention reduce the polarizability fatigue effects of such frequent changes of ferroelectric material polarization by reducing the duty cycle of the signals applied to the ferroelectric material for creating a coercive electric field. It is believed that the lower duty cycle of the signals of the present invention reduces the polarizability fatigue of the ferroelectric material by reducing the ionic migration of point charge defects within the material's lattice structure. Such ionic migration, over time, tends to move ions toward the outer boundary surfaces of the ferroelectric material thereby distorting the crystal lattice structure of the ferroelectric material. In addition, the ionic migration may tend to form oxidized layers at the outer boundary layers of the ferroelectric material where the ions tend to be deposited.

The width of signal pulses applied to the electrodes of the ferroelectric device in a memory cell 100, 200 or 600 as discussed above are reduced by the methods and apparatus of the present invention to lower the duty cycle ratio of the signal. The duty cycle of a signal as used herein was defined above broadly as the ratio of working time of a signal versus total active time of the signal. In particular, the duty cycle of the signals applied to the electrode of a ferroelectric device as discussed above is defined to be the ratio of the reduced pulse width versus the minimum cycle time of read/write operations on the memory cell 100, 200, or 600 associated with the ferroelectric device. Specifically, the methods and apparatus of the present invention discussed below describe the generation of signals having duty cycles ranging from 2% through 30%.

Figure 5:
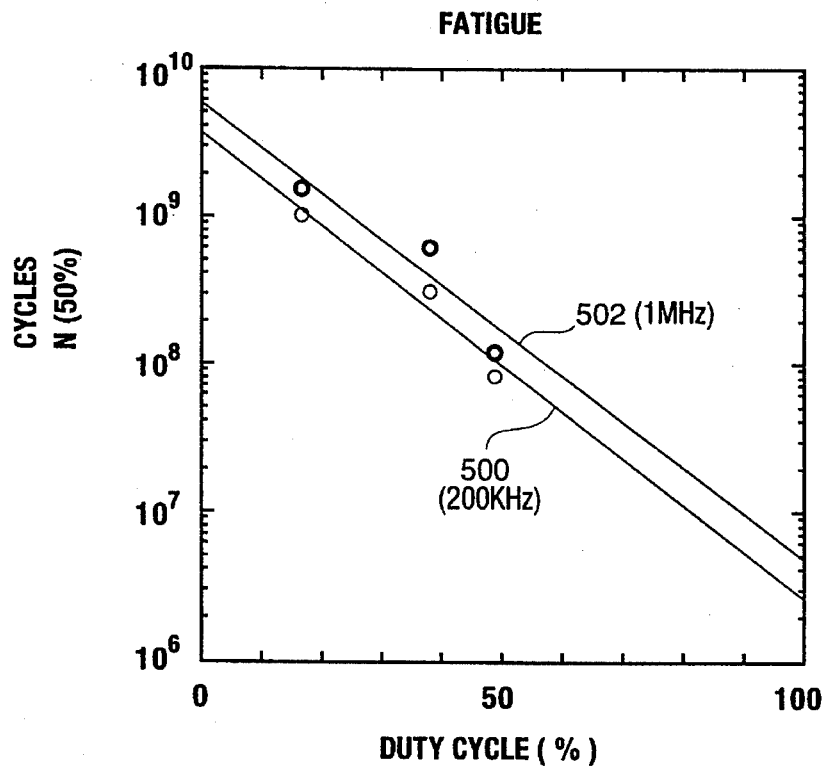
FIG. 5 is a graph which depicts the duty cycle dependency of ferroelectric fatigue at two fixed frequencies of 200 Khz and 1 Mhz.

FIG. 5 Shows the effects of the signal duty cycle on the useful life of the ferroelectric material. The data graphed in FIG. 5 reflects measurements of polarizability of the ferroelectric material as a signal which changes the direction of remnant polarization is applied at various frequencies and duty cycles. The Y axis of the graph of FIG. 5 indicates the number of cycles of polarization change before polarizability fatigue within the ferroelectric material reduces the polarizability to 50% of the starting value. This measure is labeled N(50%) to indicate the number of cycles before reaching 50% of starting polarizability. The X axis of the graph of FIG. 5 indicates the duty cycle of the signal. The line labeled 500 represents the lifetime of a ferroelectric material (measured in cycles) as a function of signal duty cycle for a signal applied at a frequency of 200-Khz. Three measured data points are shown by untilled circles: one for 15% duty cycle ratio, one for 40% and one for 50%. Line 500 represents an approximate linear curve fitting of these three data points. The line labeled 502 represents the lifetime of a ferroelectric material (measured in cycles) as a function of signal duty cycle for a signal applied at a frequency of 1-Mhz. Three measured data points are shown by filled circles: one for 15% duty cycle ratio, one for 40% and one for 50%. Line 502 represents an approximate linear curve fitting of these three data points. It can be seen from the data presented in the graph of FIG. 5 that reduced duty cycle ratio does in fact reduce the polarizability fatigue of a ferroelectric material to thereby increase the useful lifetime of the ferroelectric device in a memory cell.

Drive Circuits

Referring again to memory array 10 of FIG. 1, signals applied to a word line 162 and a bit line 164 of FIG. 1 create an electric field across the electrodes of the ferroelectric capacitor 102 of a selected memory cell 100. A memory cell 100 is selected by operation of the address and control logic discussed above. The electric field is of sufficient amplitude to force the polarization of the ferroelectric capacitor 102 to retain the polarization matching that of the electric field. Row signal drive 110 applies signals to bus 172, through row address mux 114, onto a word line 162 selected by the address and control operations discussed above. In a similar manner, column signal drive 112 applies signals to bus 170, through column address mux 116, onto a bit line 164 selected by the address and control operations discussed above. Prior memory array designs applied essentially square waveform signals to the capacitor electrodes (the term "square waveform" as used herein and as discussed above refers to a geometric characterization of the rapid rise and fall times of the signals applied to the capacitor electrodes of prior designs).

Row signal drives 110 of FIG. 1 and 210 of FIG. 2 as well as column signal drives 112 of FIG. 1 and 212 of FIG. 2 are each representative of a circuit which applies a signal to an electrode of a ferroelectric capacitor for purposes of changing the polarization thereof. Row signal drives 110 of FIG. 1 and 210 of FIG. 2 as well as column signal drives 112 of FIG. 1 and 212 of FIG. 2 are discussed below with reference to FIG. 3. For simplicity, the circuits are described as apparatus which converts an input square waveform into a desired shorter pulsed output waveform to be applied to an electrode of a selected ferroelectric capacitor. One skilled in the art will recognize that there exists many known methods and a variety of apparatus for creating pulsed waveforms, either by direct generation or by conversion of an input waveform. The circuits shown in FIG. 3 discussed below are intended only as an exemplary embodiment of apparatus which may be employed in practicing the methods of the present invention.

Figure 7:
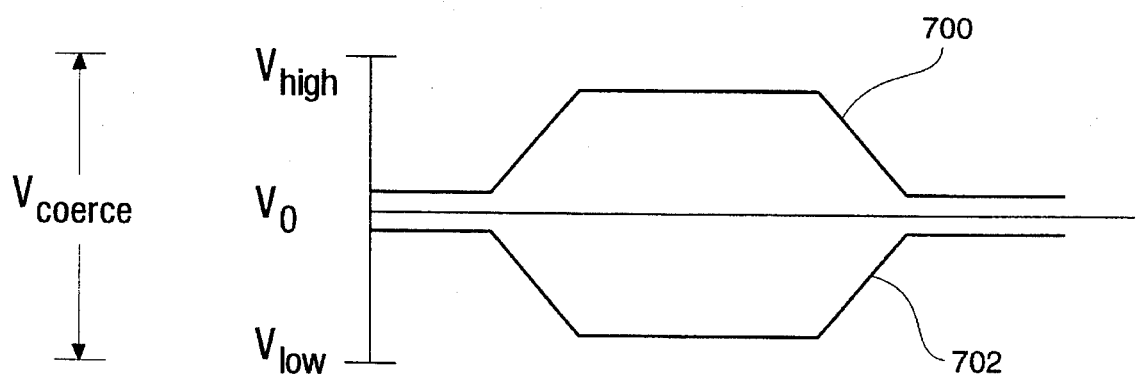
FIG. 7 shows two waveforms having equal amplitudes but opposite polarities, one each applied to each of two electrodes of a ferroelectric capacitor of the memory array of FIG. 1.

In an array of "raw" memory cells as depicted in FIG. 1, a subset of memory cells 100 share a common word line 162. Another subset of memory cells 200 share a common bit line 164. A signal applied to one electrode, either a row line 162 or a bit line 164, is simultaneously applied to all other electrodes of other ferroelectric capacitors 102 attached to that same row line 162 or bit line 164. The signal applied to each electrode, individually, is therefore lower than the amplitude required to coerce the ferroelectric capacitor to a new polarization state. However, when the signal applied to a row line 162 is combined with a signal of similar amplitude but opposite polarity on an intersecting bit line 164, the resultant field strength across the ferroelectric capacitor 102 connected to both intersecting lines is sufficient to coerce the ferroelectric capacitor 102 polarization to switch. Row signal drive 110 and column signal drive 112 of FIG. 1 are preferably adapted to generate similar signals but of opposite polarities and each signal individually having an amplitude less than the coercive threshold value required to change the polarization of the ferroelectric capacitor. FIG. 7 shows an example of such waveforms as may be applied to a row line 162 and a corresponding intersecting bit line 164. Waveform 700 of FIG. 7 is applied to a selected one of row lines 162 of FIG. 1 and waveform 702 of FIG. 7 is applied to a selected one of bit lines 164 of FIG. 1. Waveform 700 depicts a signal as applied to a row line 162 of FIG. 1 having a maximum amplitude of ($V_{HIGH-Vo}$); less than the coercive amplitude $V_{COERCE}$. Waveform 702 depicts a signal as applied to a bit line 164 of FIG. 1 having a maximum amplitude of ($V_{Low-Vo}$); also less than the coercive amplitude $V_{COERCE}$. Only at the intersection of a selected word line 162 and a selected bit line 164 will the field strength rise to an amplitude of ($V_{HIGH-VLOW}$); greater than or equal to $V_{COERCE}$. As discussed above, the duty cycle of either or both of the waveforms applied to the two electrodes may be shortened to reduce the duty cycle of the electric field applied to the selected ferroelectric capacitor 102.

It is to be expressly understood that the combination of two waveforms discussed above with respect to FIG. 7 represents the best known mode of practicing the present invention at this time. For purposes of simplification in the discussion below, the waveforms will be discussed in terms of a single waveform applied to one of the two electrodes of the capacitor 102 of a selected one of memory cells 100. One skilled in the art will readily recognize that similar drive circuitry with appropriate inversion and gain control circuitry may be utilized in both row signal drive 110 and column signal drive 112 of FIG. 1.

Those skilled in the art will recognize that signals applied to the word lines 262 of the "active" memory array 20 shown in FIG. 2 are not applied to either electrode of the associated ferroelectric capacitors 202. Word lines 262 are attached only to the gates of gating transistors 201 of a row of memory cells 200. Signals applied to a word line 262 serve only to close the gate of all gating transistors 201 common to the selected word line 262. After all gating transistors 201 common to the selected word line 262 are closed, column signal drive 212 applies a signal to bus 270, through mux 216, onto a selected plate line 264. The signal applied to the selected plate line 264 is common to all memory cells 200 connected to the selected plate line 264. Only the memory cell 200 which intersects both the selected plate line 264 and the selected word line 262 has the gating transistor 201 closed to permit the signal on the selected plate line 264 to be applied through the gating transistor 201 to one electrode of the selected ferroelectric capacitor 202. The polarization direction of the particular memory cell 200 at the intersection of the selected word line and the selected bit line is then altered by the electric field produced from application of the signal on the selected plate line 264 to one electrode of the ferroelectric capacitor 202 and the terminator 118 connected to the opposing electrode. In conventional DRAM applications, the waveform shape of the signal applied to plate line 264 by column signal drive 212 determines the shape of the rise and fall of the coercive electric field across the selected ferroelectric capacitor 201. Thus, in such applications only the signal applied to plate line 264 by column signal drive 212 would be shortened to reduce the duty cycle. However, since the signal on word line 262 controls the application of the signal on plate line 264 to the selected ferroelectric capacitor 202 through gating transistor 201, and since the voltage on both electrodes of selected ferroelectric capacitor 202 determines the net field across the capacitor, the duty cycle of either the signal waveform applied to the selected word line 262 to control the gate of the selected gating transistor 201, or the signal wave form applied to the selected plate line 264, or a combination thereof, may be shortened to reduce the duty cycle of the electric field applied to the selected ferroelectric capacitor 202.

Figure 3:
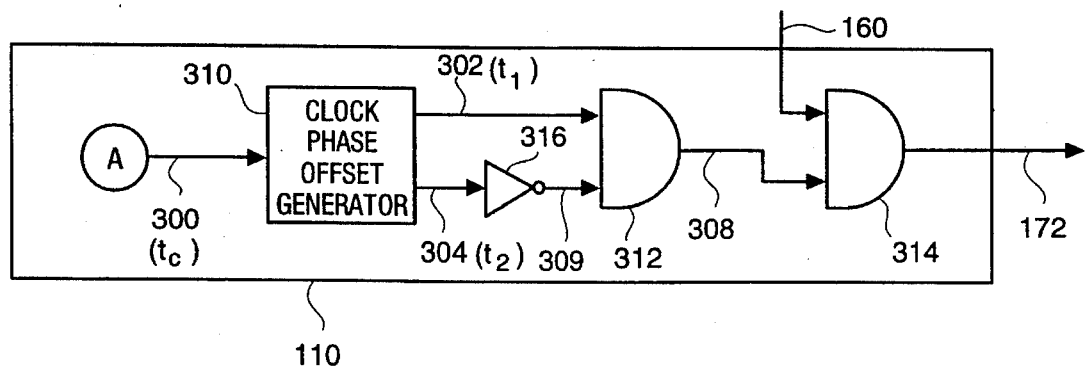
FIG. 3 is a diagram of an exemplary preferred embodiment of a circuit which controls the duty cycle of pulsed signals applied to the electrodes of ferroelectric memory elements used in the memory arrays of FIGS. 1 and 2.

FIG. 3 depicts a driver circuit 110 which implements the signal pulsing method of the present invention. Control logic 104 (of FIG. 1) applies a signal to control bus 160 indicating to row signal drive 110 that a RAS signal is to be applied to a row line 162 over line 172 through mux 114. The signal applied to control bus 160 is ANDed with a pulsed signal on line 308 through AND gate 314 to convert the RAS signal into a narrower pulsed signal. This narrower pulsed signal reduces the fatigue of the ferroelectric material in the memory cells 100 of array 10. The pulsed signal on line 308 is generated by AND gate 312. The inputs to AND gate 312 are clock signals at the operating cycle time frequency of the memory array 10. A first clock signal is applied to line 302 as a first input to AND gate 312. The second clock, applied to line 304, is phase shifted with respect to the first clock signal then inverted through inverter 316 and applied to the other input of AND gate 312. Both clocks applied to line 302 and 304 are generated by a phase shifting element 310 which generates two output clock signals phase shifted by different amounts from an input clock signal on line 300. The input clock signal on line 300 is generated by circuitry "A" which controls the clocking of all logic within memory array 10.

Figure 4:
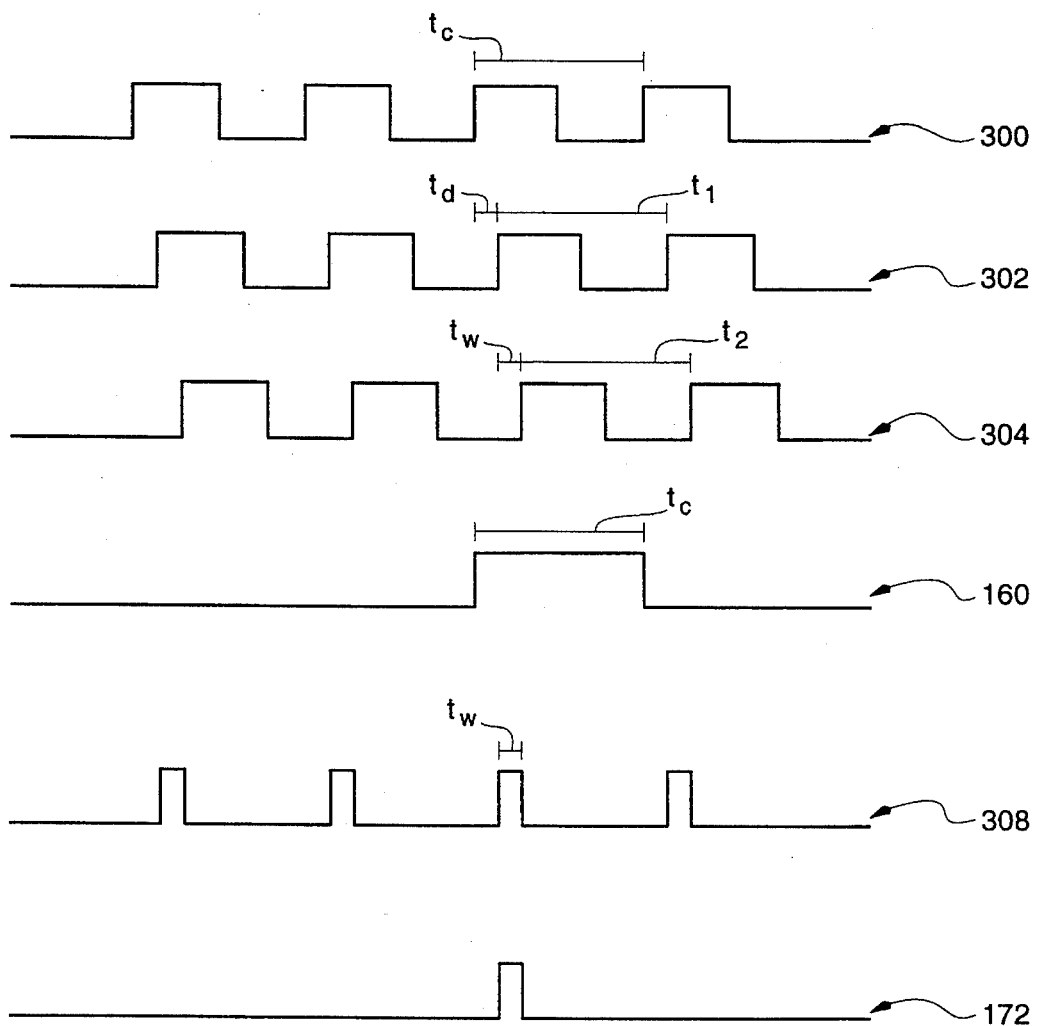
FIG. 4 is a timing diagram which represents the operation of the circuit of FIG. 3.

FIG. 4 shown a timing diagram of the signals on several lines associated with the circuit of FIG. 3. The clock signal on line 300 is the input to phase shifting element 310 of FIG. 3 and is also labelled $t_c$ as the cycle time clock of the RAM array 10. The cycle time of RAM array 10 is the time required for all associated logic signals to complete the processing of a single operation. As used herein, the minimum cycle time for RAM array 10 is the least time possible to complete a read operation of a memory cell including the address decoding as described above, and the sensing of the stored value in the selected memory cell. This minimum cycle time is shown on FIG. 4 as a clock signal having period $t_c$. The first and second phase shifted output clock signals are shown as they are applied to lines 302 and 304 by phase shifting element 310 of FIG. 3 and are labelled $t_1$ and $t_2$ respectively. The amount of phase shift between the input clock signal on line 300 and the first output clock signal on line 302 determines the delay ($t_d$) after the start of the active signal on control bus 160 to the start of the pulsed signal generated by AND gate 314 on line 172. The amount of phase shift between the first phase shifted clock signal on line 302 and the second phase shifted clock signal on line 304 determines the width of the pulsed signal ($t_w$) generated as the output of AND gate 312 on line 308. The output of AND gate 314 is applied to line 172 and is shown to be high during the period of time ($t_w$) when the pulsed signal on line 308 is high and a high signal is applied to control bus 160 by control logic 104 of FIG. 1. It will be readily recognized that the pulse delay time ($t_d$) and the pulse width time ($t_w$) may be adjusted by changing the phase shift of the clock signals applied to lines 302 and 304 relative to one another and to the input clock applied to line 300. Additional delay in the phase shift of the clock signal on line 302 versus the input clock signal on line 300 increases the delay time until the start of the pulse on line 308. Additional delay in the phase shift of the clock signal on line 304 versus the clock signal on line 302 increases the width of the pulsed signal applied to line 308.

There has been described a memory device that writes information in a memory cell which includes a ferroelectric capacitor with reduced polarizability fatigue within the ferroelectric material. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, other addressing or control logic designs may be employed. Or the sequence or timing of signals described above may be altered while achieving an equivalent result in reducing the duty cycle of signals applied to the electrodes of a ferroelectric capacitor. Or equivalent structures and process may be substituted for the various structures and processes described. Or a variety of different circuits and ferroelectric materials may be used. Consequently, the invention is to be construed as embracing each and every novel feature and novel combination of features present in, or possessed by, the memory apparatus and processes described.

We claim:

1. In a non-volatile memory device having at least one ferroelectric memory element within at least one memory cell, wherein a polarization state of said ferroelectric memory element is associated with a stored logic "1" and another polarization state of said ferroelectric memory element is associated with a stored logic "0", a method for reducing polarizability fatigue of said ferroelectric memory element comprising the steps of:

receiving a request to coerce the state of polarization of said ferroelectric memory element to a desired state of polarization;

generating, responsive to said request, a pulsed electric field signal having a directional polarity and having a maximum amplitude sufficient to alter said state of polarization of said ferroelectric memory element, said pulsed electric field signal having a predetermined pulse duration less than about half the minimum cycle time of said ferroelectric memory element; and applying, responsive to said request, said pulsed electric field signal to said ferroelectric memory element such that the state of polarization of said ferroelectric memory element is coerced to said desired state of polarization.

2. The method of claim 1 wherein said ferroelectric memory element is a ferroelectric capacitor.

3. The method of claim 1 wherein said predetermined pulse duration is greater than about 2% of said minimum cycle time of said ferroelectric memory element and said predetermined pulse duration is less than about 30% of said minimum cycle time of said ferroelectric memory element.

4. The method of claim 1 wherein the step of applying said pulsed electric field to said ferroelectric memory element comprises applying said pulsed electric field signal to one electrode of said ferroelectric memory element.

5. The method of claim 1:

wherein the step of generating said pulsed electric field comprises:

generating a first signal pulse having a polarity and having a maximum amplitude less than said amplitude sufficient to alter said state of polarization of said ferroelectric memory element, and generating a second signal pulse having a polarity opposite said polarity of said first signal pulse and having a maximum amplitude less than said amplitude sufficient to alter said state of polarization of said ferroelectric memory element, wherein at least one of said first signal pulse and said second signal pulse has a predetermined pulse duration less than about half the minimum cycle time of said ferroelectric memory element; and wherein the step of applying said pulsed electric field to said ferroelectric memory element comprises applying said first signal pulse to one electrode of said ferroelectric memory element and applying said second signal pulse to another electrode of said ferroelectric memory element.

6. The method of claim 1 wherein the step of applying said pulsed electric field to said ferroelectric memory element comprises applying said pulsed electric field to one electrode of said ferroelectric memory element through a gating transistor connected to said electrode of said ferroelectric memory element.

7. The method of claim 6 wherein the step of applying said pulsed electric field to said ferroelectric memory element further comprises:

applying said pulsed electric field to one electrode of said ferroelectric memory element through a gating transistor connected to said electrode of said ferroelectric memory element; and applying said pulsed electric field to the gate electrode of said gating transistor.

8. A non-volatile memory device comprising:

at least one ferroelectric memory element within at least one memory cell wherein a polarization state of said ferroelectric memory element is associated with a stored logic "1" and another polarization state of said ferroelectric memory element is associated with a stored logic "0";

means for generating a pulsed waveform electric field signal, said signal having a directional polarity and having a maximum amplitude sufficient to alter said state of polarization of said ferroelectric memory element, said electric field signal having a predetermined pulse duration less than about half the minimum cycle time of said ferroelectric memory element; and means connected to an electrode of said ferroelectric memory element and associated with said means for generating for applying said electric field signal to said ferroelectric memory element such that the state of polarization of said ferroelectric memory element is coerced to a desired state of polarization.

9. The memory device of claim 8 wherein said ferroelectric memory element is a ferroelectric capacitor.

10. The memory device of claim 8 wherein said predetermined pulse duration is greater than about 2% of said minimum cycle time of said ferroelectric memory element and said predetermined pulse duration is less than about 30% of said minimum cycle time of said ferroelectric memory element.

11. The memory device of claim 8 wherein said pulsed electric field is applied to said ferroelectric memory element by applying said pulsed electric field signal to one electrode of said ferroelectric memory element.

12. The memory device of claim 8:

wherein said means for generating said pulsed waveform electric field signal comprises:

first means for generating a first signal pulse having a polarity and having a maximum amplitude less than said amplitude sufficient to alter said state of polarization of said ferroelectric memory element, and second means for generating a second signal pulse having a polarity opposite said polarity of said first signal pulse and having a maximum amplitude less than said amplitude sufficient to alter said state of polarization of said ferroelectric memory element, wherein at least one of said first signal pulse and said second signal pulse has a predetermined pulse duration less than about half the minimum cycle time of said ferroelectric memory element; and wherein said means for applying said pulsed waveform electric field signal comprises:

first means for applying said first signal pulse to one electrode of said ferroelectric memory element, and second means for applying said second signal pulse to another electrode of said ferroelectric memory element.

13. The memory device of claim 8 wherein said pulsed electric field is applied to said ferroelectric memory element by applying said pulsed electric field to one electrode of said ferroelectric memory element through the source and drain of a gating transistor connected to said electrode of said ferroelectric memory element and applying said pulsed electric.

14. The memory device of claim 13 wherein said pulsed electric field is applied to said ferroelectric memory element by:

applying said pulsed electric field to one electrode of said ferroelectric memory element through a gating transistor connected to said electrode of said ferroelectric memory element; and applying said pulsed electric field to the gate electrode of said gating transistor.

* * * * *